(12) United States Patent
Heistand et al.

(10) Patent No.: US 9,886,067 B2
(45) Date of Patent: Feb. 6, 2018

(54) SYSTEMS AND METHODS FOR TOOL-LESS BOARD TO BOARD COUPLING

(71) Applicant: Dell Products L.P., Round Rock, TX (US)

(72) Inventors: Raymond Dewine Heistand, Round Rock, TX (US); Yen-Lin Wang, Taipei (TW); Kuang Hsi Lin, Bade (TW); Hsu-Chu Wang, Taipei (TW)

(73) Assignee: Dell Products L.P., Round Rock, TX (US)

( * ) Notice: Subject to any disclaimer, the term of this patent is extended or adjusted under 35 U.S.C. 154(b) by 31 days.

(21) Appl. No.: 14/623,218

(22) Filed: Feb. 16, 2015

(65) Prior Publication Data

US 2016/0242309 A1 Aug. 18, 2016

(51) Int. Cl.
*H05K 7/14* (2006.01)
*G06F 1/18* (2006.01)

(52) U.S. Cl.
CPC ........... *G06F 1/184* (2013.01); *H05K 7/1417* (2013.01); *H05K 7/1489* (2013.01)

(58) Field of Classification Search
CPC ......... H05K 2201/10189; H05K 3/325; H05K 7/2039; H05K 1/0219; H05K 1/0245; H05K 1/118; H05K 1/147; H05K 2201/097; H05K 2201/10325; H05K 3/368; H05K 7/1069; H05K 7/20218; H05K 7/20254; H05K 7/20454; H05K 1/0209; H05K 7/1489; H05K 7/1417; H05K 7/1409; H05K 7/145; H05K 7/1418; H05K 7/1425; H05K 7/1405; H05K 7/149; H05K 7/1461; H05K 7/1429; G06F 1/186; G06F 1/185; G06F 1/184; G06F 1/1656; G06F 1/187
USPC ...... 361/679.32–679.39, 724–727, 747, 801, 361/802, 679.58; 312/223.1–223.2
See application file for complete search history.

(56) References Cited

U.S. PATENT DOCUMENTS

| | | | | |
|---|---|---|---|---|
| 5,535,100 A | * | 7/1996 | Lubahn | G06F 1/184 361/752 |
| 6,791,843 B1 | * | 9/2004 | Dobbs | H01R 13/62933 361/740 |
| 2004/0150973 A1 | * | 8/2004 | Junkins | H05K 7/1418 361/801 |
| 2004/0174686 A1 | * | 9/2004 | Rubenstein | H05K 7/1409 361/801 |

\* cited by examiner

*Primary Examiner* — Anthony Haughton
*Assistant Examiner* — Ingrid Wright
(74) *Attorney, Agent, or Firm* — Jackson Walker L.L.P.

(57) ABSTRACT

In accordance with embodiments of the present disclosure, a latch may include a pivoting member and a leaf-spring member. The pivoting member may be configured to rotatably couple the latch to a chassis such that the latch may rotate between a first position and a second position relative to the chassis. The leaf-spring feature may be shaped and arranged in order to, as the latch is rotated between the first position and the second position, apply a mechanical force to a first circuit board to mate a first connector of the first circuit board to a second connector of a second circuit board.

13 Claims, 6 Drawing Sheets

SYSTEMS AND METHODS FOR TOOL-LESS BOARD TO BOARD COUPLING

TECHNICAL FIELD

The present disclosure relates in general to information handling systems, and more particularly to systems and methods for coupling an information handling resource embodied in a circuit board to another circuit board.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Oftentimes, information handling systems and other information handling resources (e.g., storage devices, input/output devices, and other peripheral devices) are each manufactured in a modular form factor and may be configured to be disposed in a chassis configured to receive such modular components. Such a chassis and its component modular information handling systems and information handling resources typically include various rails, carriers, and other mechanical components allowing for a person to add and remove the modular information handling systems and information handling resources from the chassis.

In an information handling system, a circuit board may mechanically and electrically couple to another circuit board (e.g., a midplane, backplane, or motherboard) via an edge connector that is coupled to a slot of the other circuit board, with additional mechanical support provided between the circuit board and a chassis housing components of the information handling system. Such additional support may be required where the mechanical support provided by coupling the edge connector to its corresponding slot is insufficient. For instance, in a circuit board which functions as a backplane for receiving modular memory modules, such structural attachment between circuit board and chassis may be desired to ensure proper alignment for deflection and sufficient structural support to maintain electrical coupling.

The density of components placed in information handling systems continues to increase, and such increase leads to space constraints, as manufacturers of information handling systems attempt to maintain and/or reduce the physical footprint of information handling systems. Thus, it may be desirable to reduce the volume of space required by a physical structure of a chassis while maintaining adequate mechanical support for information handling resources of the information handling system chassis. Thus, many board-to-board connectors often have a low profile with short pin lengths to minimize physical footprint. However, due to such low profile, mechanical tolerances in an information handling system comprising a board-to-board connector may lead to insufficient coupling between a male connector (e.g., an edge connector) with a corresponding female connector (e.g., a slot connector).

SUMMARY

In accordance with the teachings of the present disclosure, the disadvantages and problems associated with board-to-board coupling may be reduced or eliminated.

In accordance with embodiments of the present disclosure, a latch may include a pivoting member and a leaf-spring member. The pivoting member may be configured to rotatably couple the latch to a chassis such that the latch may rotate between a first position and a second position relative to the chassis. The leaf-spring feature may be shaped and arranged in order to, as the latch is rotated between the first position and the second position, apply a mechanical force to a first circuit board to mate a first connector of the first circuit board to a second connector of a second circuit board.

In accordance with these and other embodiments of the present disclosure, an information handling system may comprise a chassis and a latch including a pivoting member and a leaf-spring member. The pivoting member may be configured to rotatably couple the latch to a chassis such that the latch may rotate between a first position and a second position relative to the chassis. The leaf-spring feature may be shaped and arranged in order to, as the latch is rotated between the first position and the second position, apply a mechanical force to a first circuit board to mate a first connector of the first circuit board to a second connector of a second circuit board.

In accordance with these and other embodiments of the present disclosure, a method may include rotatably coupling a latch to a chassis such that the latch may rotate between a first position and a second position relative to the chassis. The method may also include forming a leaf-spring feature in the latch shaped and arranged in order to, as the latch is rotated between the first position and the second position, apply a mechanical force to a first circuit board to mate a first connector of the first circuit board to a second connector of a second circuit board.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
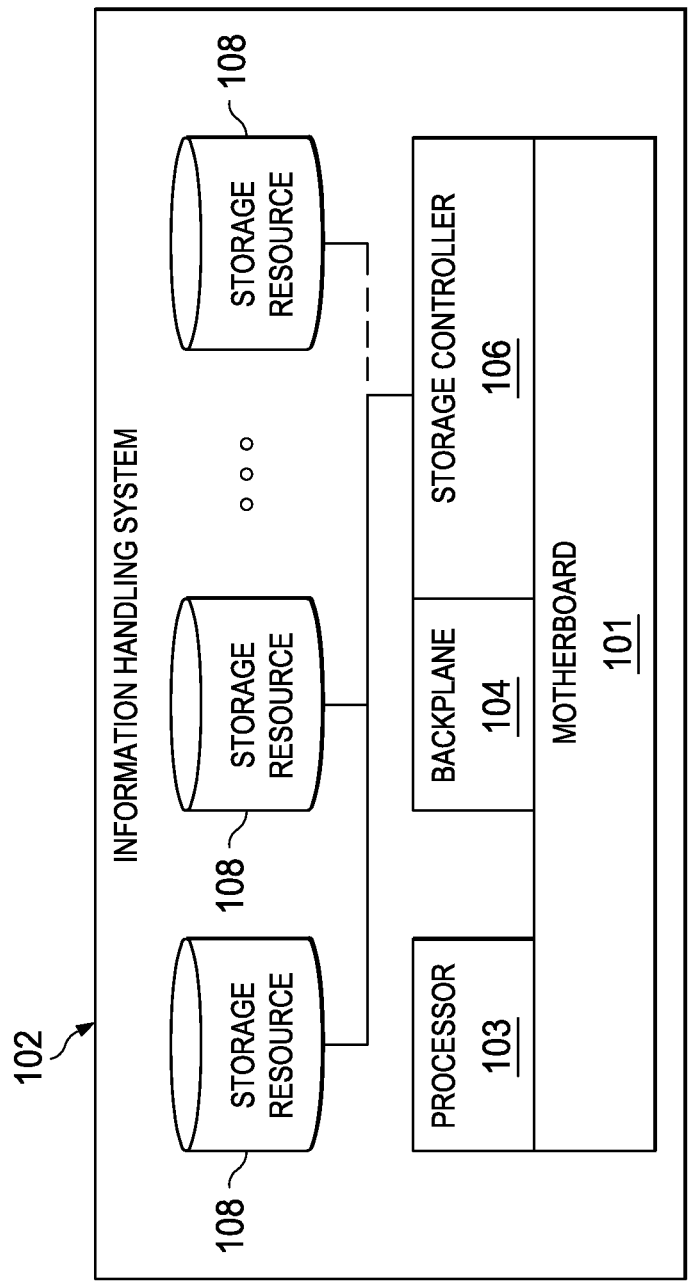
FIG. 1 illustrates a block diagram of selected components of an example information handling system, in accordance with embodiments of the present disclosure.

Preferred embodiments and their advantages are best understood by reference to FIGS. 1-6, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU"), microcontroller, or hardware or software control logic. Additional components of the information handling system may include one or more storage devices, one or more communications ports for communicating with external devices as well as various input/output ("I/O") devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, service processors, basic input/output systems (BIOSs), buses, memories, I/O devices and/or interfaces, storage resources, network interfaces, motherboards, and/or any other components and/or elements of an information handling system.

For the purposes of this disclosure, circuit boards may broadly refer to printed circuit boards (PCBs), printed wiring boards (PWBs), printed wiring assemblies (PWAs) etched wiring boards, and/or any other board or similar physical structure operable to mechanically support and electrically couple electronic components (e.g., packaged integrated circuits, slot connectors, etc.). A circuit board may comprise a substrate of a plurality of conductive layers separated and supported by layers of insulating material laminated together, with conductive traces disposed on and/or in any of such conductive layers, with vias for coupling conductive traces of different layers together, and with pads for coupling electronic components (e.g., packaged integrated circuits, slot connectors, etc.) to conductive traces of the circuit board.

FIG. 1 illustrates a block diagram of an example information handling system 102. In some embodiments, information handling system 102 may comprise a server. In other embodiments, information handling system 102 may comprise networking equipment for facilitating communication over a communication network. In yet other embodiments, information handling system 102 may comprise a personal computer, such as a laptop, notebook, or desktop computer.

As shown in FIG. 1, information handling system 102 may include a motherboard 101, a processor 103 coupled to motherboard 101, a backplane 104 coupled to motherboard 101, a storage controller 106 coupled to motherboard 101, and one or more storage resources 108 coupled to storage controller 106. Motherboard 101 may comprise a circuit board configured to provide structural support for one or more information handling resources of information handling system 102 and/or electrically couple one or more of such information handling resources to each other and/or to other electric or electronic components external to information handling system 102.

Processor 103 may include any system, device, or apparatus configured to interpret and/or execute program instructions and/or process data, and may include, without limitation, a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in a storage resource 108, memory and/or another component of information handling system 102.

Backplane 104 may comprise any system, device, or apparatus configured to interconnect information handling system 102 with information handling resources of information handling system 102. Accordingly, backplane 104 may comprise a circuit board having slots and/or connectors configured to receive information handling resources.

Storage controller 106 may include any system, apparatus, or device operable to manage the communication of data between processor 103 and one or more of storage resources 108. In certain embodiments, a storage controller 106 may provide functionality including, without limitation, disk aggregation and redundancy (e.g., RAID), I/O routing, and error detection and recovery. As shown in FIG. 1, a storage controller 106 may be coupled to backplane 104 (e.g., via a connector, as described in greater detail below) and motherboard 101 (e.g., via another connector, as described in greater detail below). Storage controller 106 may also have features supporting shared storage and high availability. In some embodiments, storage controller 106 may comprise a PowerEdge RAID Controller (PERC) manufactured by Dell Inc.

Storage resources 108 may be communicatively coupled to storage controller 106, and may include any system, device, or apparatus configured to retain program instructions and/or data for a period of time (e.g., computer-readable media). Storage resources 108 may include hard disk drives, magnetic tape libraries, optical disk drives, magneto-optical disk drives, compact disk drives, compact disk arrays, disk array controllers, and/or any other system, apparatus or device operable to store media.

In addition to motherboard 101, processor 103, backplane 104, storage controller 106, and storage resources 108, information handling system 102 may include one or more other information handling resources.

Figure 2A:
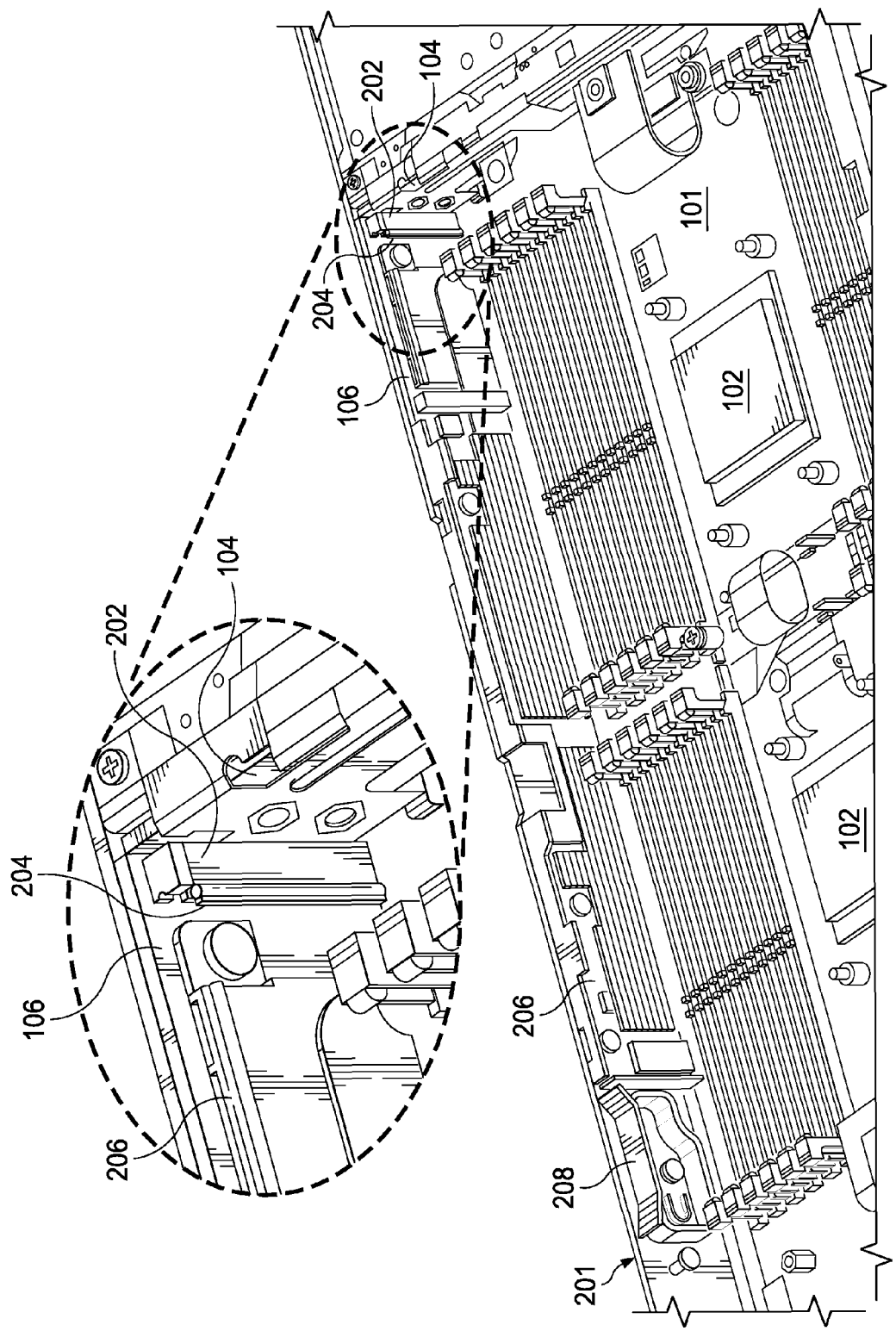
FIG. 2A illustrates a perspective view of selected components of the example information handling system of FIG. 1, in accordance with embodiments of the present disclosure.

FIG. 2A illustrates a perspective view of selected components of information handling system 102 of FIG. 1, in accordance with embodiments of the present disclosure. As shown in FIG. 2A, various information handling resources of information handling system 102 may be housed within a chassis 201. Chassis 201 may comprise an enclosure that serves as a container for one or more information handling systems and information handling resources, and may be constructed from steel, aluminum, plastic, and/or any other suitable material. Although the term "chassis" is used, chassis 201 may also be referred to as a case, cabinet, tower, box, enclosure, and/or housing. In some embodiments, chassis 201 may be configured to hold and/or provide power to a plurality of information handling resources.

Also as shown in FIG. 2A, storage controller 106 may comprise a low-profile connector 204 (e.g., a male connector) configured to engage with a corresponding connector 202 (e.g., a female connector) of backplane 104 in order to communicatively couple storage controller 106 to backplane 104. In addition, storage controller 106 may be at least partially housed in a circuit board assembly 206 or other mechanical structure. Structure and function of circuit board assembly 206 is described in greater detail below.

A tool-less latch 208 may be rotatably coupled to chassis 201 and configured to, in a locked position, apply a mechanical force to circuit board assembly 206 in order to ensure proper mating of connector 204 to connector 202, as described in greater detail below.

Figure 2B:
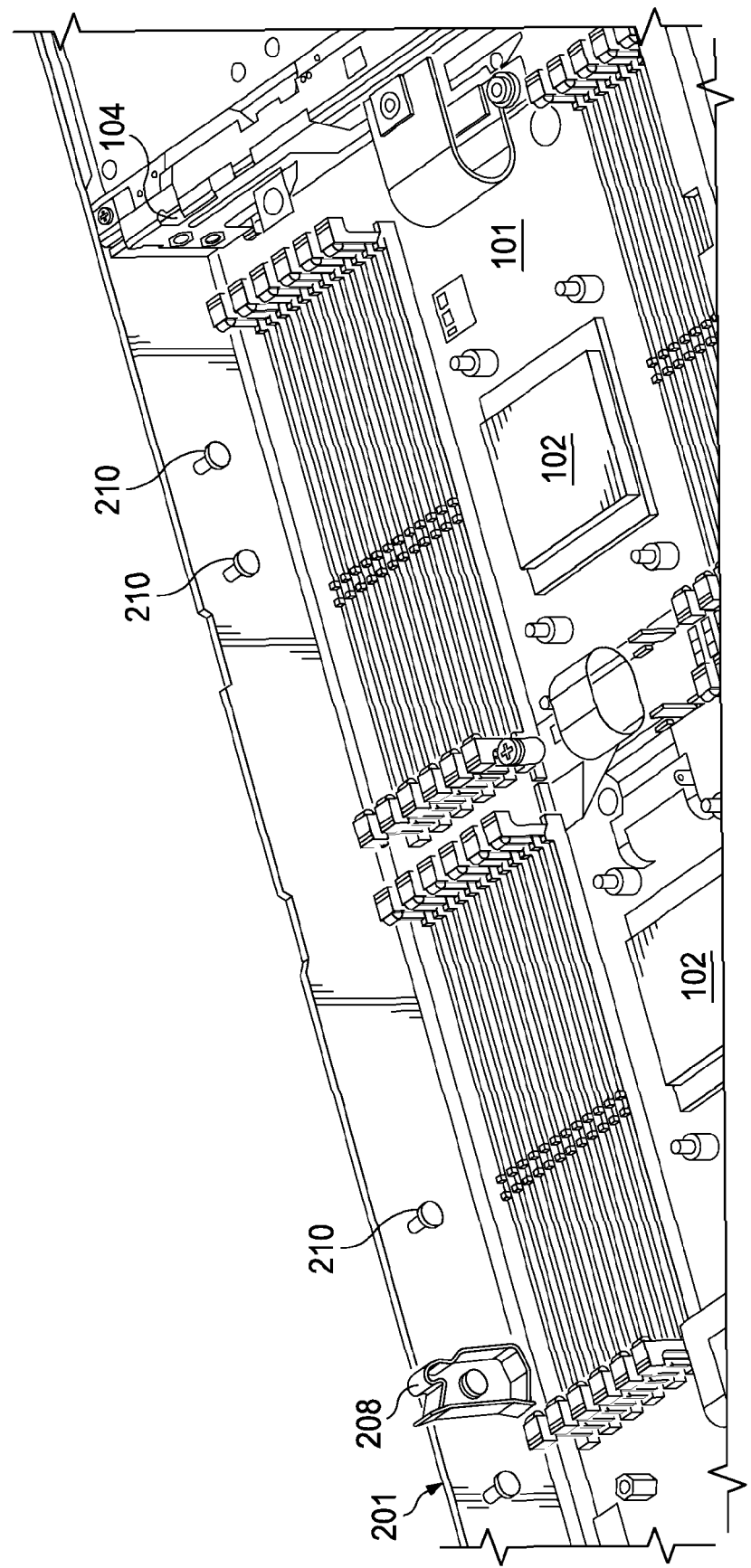
FIG. 2B illustrates a perspective view of selected components of the example information handling system of FIG. 1 with a circuit board assembly removed, in accordance with embodiments of the present disclosure.

FIG. 2B illustrates a perspective view of selected components of information handling system 102 with board assembly 206 removed, in accordance with embodiments of the present disclosure. As shown in FIG. 2B, chassis 201 may comprise one or more standoffs 210 protruding substantially perpendicularly from a wall of chassis 201 which is substantially parallel to storage controller 106 (when present in information handling system 102). As described in greater detail below, one or more standoffs 210 may be configured to engage with corresponding mechanical features of circuit board assembly 206 in order to mechanically align, guide, and constrain the movement of circuit board assembly 206 relative to other components of information handling system 102.

Figure 3:
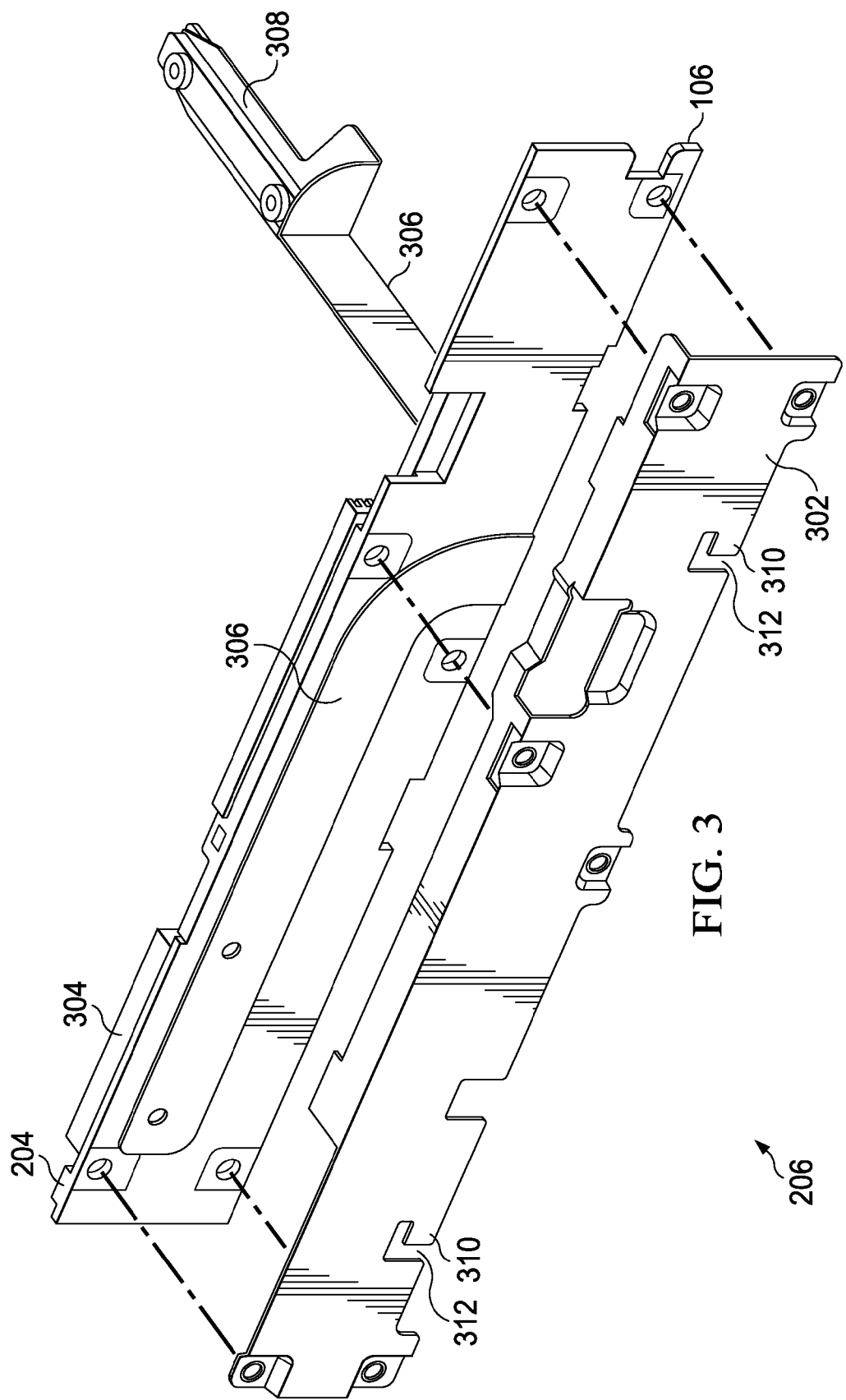
FIG. 3 illustrates an exploded perspective view of a circuit board assembly, in accordance with embodiments of the present disclosure.

FIG. 3 illustrates an exploded perspective view of circuit board assembly 206, in accordance with embodiments of the present disclosure. As shown in FIG. 3, circuit board assembly 206 may comprise a first mechanical member 302, a second mechanical member 304, a ribbon cable 306, and a connector 308. First mechanical member 302 may comprise a bracket, plate, or other mechanical structure formed from steel, aluminum, other metal, or plastic. Second mechanical member 304 may comprise a bracket, plate, or other mechanical structure formed from steel, aluminum, other metal, or plastic. In some embodiments, second mechanical member 304 may include or may be part of a heat sink or other heat dissipating structure configured to transfer heat from storage controller 106 to air ambient to such heat dissipating structure, in order to cool one or more components of storage controller 106. Ribbon cable 306 may comprise a plurality of conductive wires configured to communicatively couple one or more components of storage controller 106 to motherboard 101 via connector 308.

As depicted in FIG. 3, each of first mechanical member 302, second mechanical member 304, and ribbon cable 306 may comprise one or more openings for receiving a screw or other fastener for mechanically coupling first mechanical member 302, second mechanical member 304, and/or ribbon cable 306 together. In some embodiments, one or more of such openings may be threaded to mechanically engage with such screws or other fasteners. In addition, connector 308 may also include one or more openings for receiving a screw or other fastener for mechanically coupling connector 308 to motherboard 101.

Figure 4:
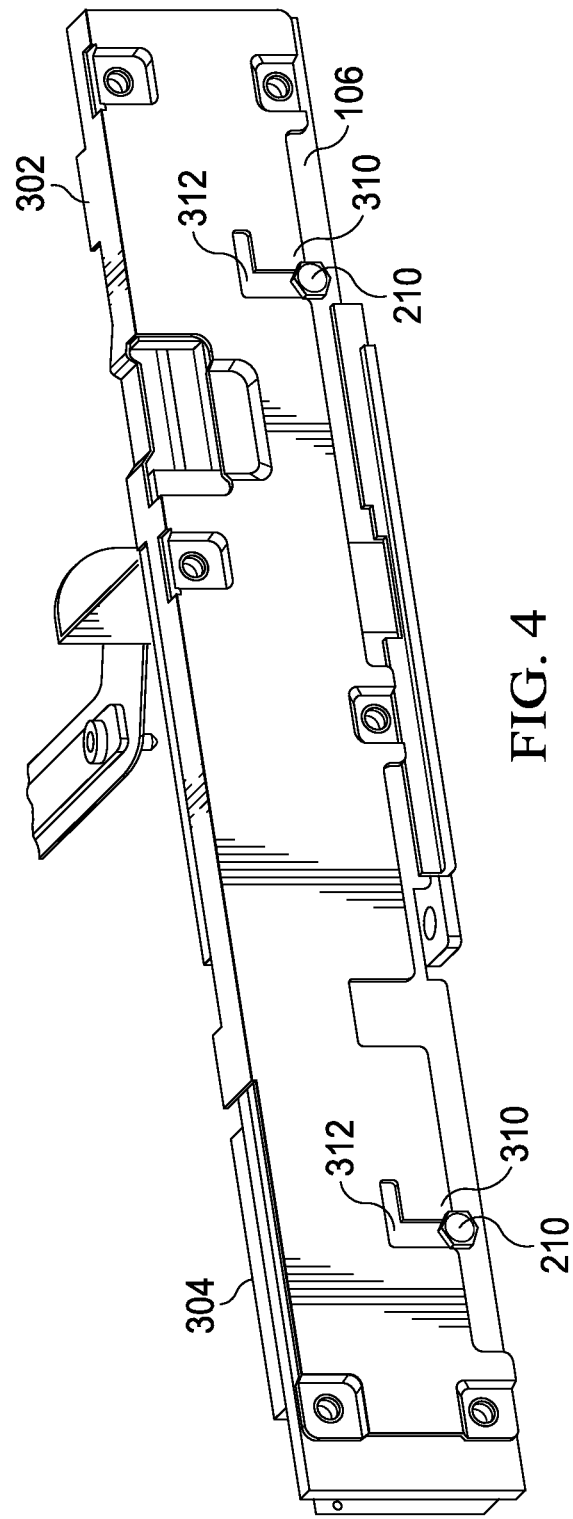
FIG. 4 illustrates a perspective view of a circuit board assembly engaging with standoffs of a chassis, in accordance with embodiments of the present disclosure.

As further depicted in FIG. 3, and as depicted in more detail in FIG. 4, first mechanical member 302 may include guiding/alignment features each comprising an opening 312 and a flange 310 arranged so as to allow a corresponding standoff 210 to pass into an opening 312 and mechanically engage with flange 310 in order to guide motion of circuit board assembly 206 in a first direction and a second direction opposite to the first direction while substantially constraining or limiting motion of circuit board assembly 206 in directions orthogonal to the first direction, in order to align connector 204 with connector 202 to ensure proper mating of conductive elements (e.g., pins or pads) of connector 204 to corresponding conductive elements (e.g., pins or pads) of connector 202 as connector 204 is engaged with connector 202.

Figure 5:
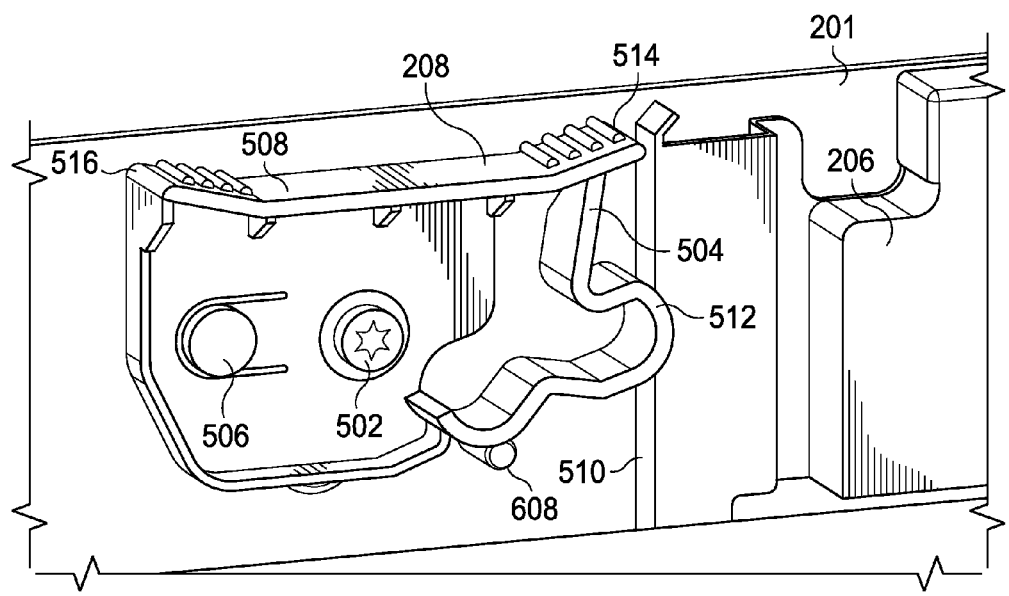
FIG. 5 illustrates a detailed perspective view of a latch engaging with a circuit board assembly, in accordance with embodiments of the present disclosure.
Figure 6:
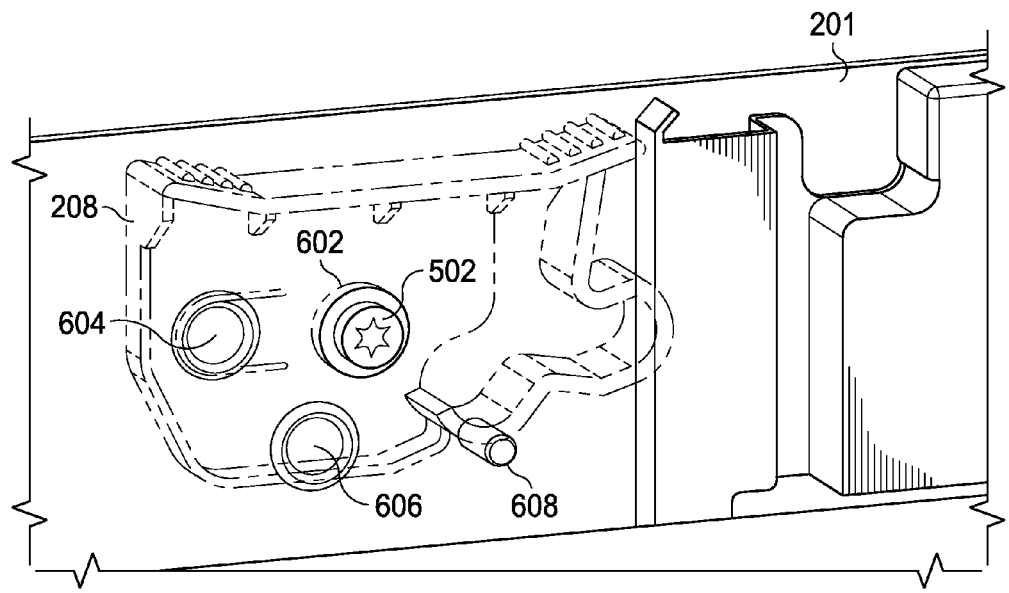
FIG. 6 illustrates a detailed perspective view of features of a chassis for constraining rotation of a latch, in accordance with embodiments of the present disclosure.

FIG. 5 illustrates a detailed perspective view of tool-less latch 208 engaging with circuit board assembly 206, in accordance with embodiments of the present disclosure, while FIG. 6 illustrates a detailed perspective view of features of chassis 201 for constraining rotation of tool-less latch 208, in accordance with embodiments of the present disclosure. As shown in FIG. 5, tool-less latch 208 may be rotatably coupled to chassis 201 via a pivoting member 502 configured to engage with a corresponding feature 602 of chassis 201 depicted in FIG. 6. As shown in FIG. 6, chassis 201 may include openings 604 and 606 each configured to receive a protrusion from a spring-loaded detent 506 of tool-less latch 208. Accordingly, when tool-less latch 208 is in a locked position (as shown in FIGS. 2A and 5), spring-loaded detent 506 may apply a spring force causing a protrusion therefrom to engage with opening 604 in order to constrain rotation of tool-less latch 208 from the locked position. Similarly, when tool-less latch 208 is in an unlocked position (as shown in FIG. 2B), spring-loaded detent 506 may apply a spring force causing a protrusion therefrom to engage with opening 606 in order to constrain rotation of tool-less latch 208 from the unlocked position. Also as shown in FIG. 6, chassis 201 may include a post 608 protruding therefrom. Such post 608 may limit motion of tool-less latch 208, to prevent over rotation of tool-less latch past the locked position.

When rotated from the unlocked position to the locked position, a contoured leaf-spring feature 504 of tool-less latch 208 may apply a mechanical force on circuit board assembly 206 substantially in a direction running from the feature to connector 204. Such spring-like mechanical force may cause conductive elements (e.g., pins or pads) of connector 204 to electrically couple to corresponding conductive elements (e.g., pins or pads) of connector 202 as connector 204 is engaged with connector 202, in order to ensure proper mating of connector 204 and connector 202. Furthermore, leaf-spring feature 504 may be configured to deflect in a direction substantially opposite of that of the force applied to circuit board assembly 206, thus preventing an overloading of mechanical force by leaf-spring feature 504 onto circuit board assembly 206 that may cause damage to connector 204 or connector 202. Accordingly, leaf-spring feature 504 may be able to absorb mechanical tolerance of the various components of information handling system 102.

When in the locked position, leaf-spring feature 504 may engage with an edge 510 or other feature of circuit board assembly 206 in a manner such that as tool-less latch 208 is rotated from the unlocked position to the locked position, edge 510 maintains contact with a rounded feature 512 of leaf-spring feature 504, such point of contact moving from one side of an approximate center of rounded feature 512 to the other side of the approximate center, thus causing leaf-spring feature 504 to apply an at-least partially downward force to the remainder of tool-less latch 208 to further secure tool-less latch 208 in the locked position, which may prevent mechanical vibration or other effects from causing tool-less latch 208 to disengage from the locked position.

To operate tool-less latch 208, a user may apply force to handle 508. For example, to rotate tool-less latch 208 from the unlocked position to the locked position, a user may apply a force at or near an end 514 of handle 508 nearest to circuit board assembly 206 (when present in information handling system 102). Similarly, to rotate tool-less latch 208 from the locked position to the unlocked position, a user may apply a force at or near an end 516 of handle 508 opposite of end 514.

While the foregoing discussion contemplates use of tool-less latch 208 to engage a connector of a storage controller with a connector of a backplane, the systems and methods described herein may be applied to engage any suitable connector of a suitable circuit board to another suitable connector of another suitable circuit board.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A latch, comprising:
 a pivoting member configured to rotatably couple the latch to a chassis such that the latch is rotatable between a first position and a second position relative to the chassis; and
 a leaf-spring feature shaped and arranged in order to, as the latch is rotated between the first position and the second position, apply a mechanical force to a first circuit board to mate a first connector of the first circuit board to a second connector of a second circuit board;
 wherein the leaf-spring feature comprises a rounded feature such that as the latch is rotated from the first position to the second position, a structural feature of the first circuit board or a mechanical structure supporting the first circuit board is operable to maintain contact with the rounded feature, wherein a point of contact with the structural feature is operable to move from one side of an approximate center of the rounded feature to another side of the approximate center during such rotation such that a force on the rounded feature is operable to constrain rotation of the latch from the second position.

2. The latch of claim 1, the leaf-spring feature further configured to deflect in a direction substantially opposite of that of the mechanical force.

3. The latch of claim 1, further comprising a spring-loaded detent having a projection arranged to engage with a corresponding feature of the chassis in order to constrain rotation of the latch from at least one of the first position and the second position.

4. The latch of claim 3, wherein the projection of the spring-loaded detent is arranged to engage with a plurality of corresponding features of the chassis in order to constrain rotation of the latch from both the first position and the second position.

5. An information handling system comprising:
 a chassis; and
 a latch, comprising:
 a pivoting member configured to rotatably couple the latch to the chassis such that the latch may rotate between a first position and a second position relative to the chassis;
 a leaf-spring feature shaped and arranged in order to, as the latch is rotated between the first position and the second position, apply a mechanical force to a first circuit board housed in the chassis to mate a first connector of the first circuit board to a second connector of a second circuit board housed in the chassis; and
 a spring-loaded detent having a projection arranged to engage with a corresponding feature of the chassis in order to constrain rotation of the latch from at least one of the first position and the second position.

6. The information handling system of claim 5, the leaf-spring feature further configured to deflect in a direction substantially opposite of that of the mechanical force.

7. The information handling system of claim 5, wherein the projection of the spring-loaded detent is arranged to engage with a plurality of corresponding features of the chassis in order to constrain rotation of the latch from both the first position and the second position.

8. The information handling system of claim 5, wherein the leaf-spring feature comprises a rounded feature such that as the latch is rotated from the first position to the second position, a structural feature of the first circuit board or a mechanical structure supporting the first circuit board maintains contact with the rounded feature, wherein a point of contact with the structural feature moves from one side of an approximate center of the rounded feature to the other side of the approximate center during such rotation, causing a force on the rounded feature constraining rotation of the latch from the second position.

9. The information handling system of claim 5, the chassis further comprising at least one standoff projecting from a wall thereof and configured to engage with a corresponding feature of a circuit board assembly supporting the first circuit board in order to align the first connector with the second connector and guide movement of the circuit board assembly.

10. A method, comprising:
 rotatably coupling a latch to a chassis such that the latch may rotate between a first position and a second position relative to the chassis;
 forming a leaf-spring feature in the latch shaped and arranged in order to, as the latch is rotated between the first position and the second position, apply a mechanical force to a first circuit board to mate a first connector of the first circuit board to a second connector of a second circuit board; and
 forming in the latch a spring-loaded detent having a projection arranged to engage with a corresponding feature of the chassis in order to constrain rotation of the latch from at least one of the first position and the second position.

11. The method of claim 10, the leaf-spring feature further configured to deflect in a direction substantially opposite of that of the mechanical force.

12. The method of claim 10, wherein the spring-loaded detent is further configured to constrain rotation of the latch from both the first position and the second position.

13. The method of claim 10, further comprising forming a rounded feature in the leaf-spring feature such that as the latch is rotated from the first position to the second position, a structural feature of the first circuit board or a mechanical structure supporting the first circuit board maintains contact with the rounded feature, wherein a point of contact with the structural feature moves from one side of an approximate center of the rounded feature to the other side of the approximate center during such rotation, causing a force on the rounded feature constraining rotation of the latch from the second position.

\* \* \* \* \*